United States Patent [19]
Tsukada et al.

[11] Patent Number: 5,470,796
[45] Date of Patent: Nov. 28, 1995

[54] ELECTRONIC PACKAGE WITH LEAD WIRE CONNECTIONS AND METHOD OF MAKING SAME

[75] Inventors: Yutaka Tsukada; Yasukazu Kobayakawa; Yoji Maeda, all of Shiga; Shuhei Tsuchita, Kusatsu, all of Japan

[73] Assignee: International Business Machines Corporation, Armonk, N.Y.

[21] Appl. No.: 426,536

[22] Filed: Apr. 21, 1995

Related U.S. Application Data

[62] Division of Ser. No. 186,737, Jan. 25, 1994.

[51] Int. Cl.⁶ ..................................... H01L 21/60
[52] U.S. Cl. ................ 437/209; 437/211; 437/214; 437/217; 437/219; 437/220
[58] Field of Search ................. 437/209, 210, 437/211, 212, 213, 214, 215, 216, 217, 218, 219, 220, 221, 222, 223, 224

[56] References Cited

U.S. PATENT DOCUMENTS

| | | | |
|---|---|---|---|
| 4,689,875 | 9/1987 | Solstad | 437/211 |
| 5,198,391 | 3/1993 | Rösel et al. | 437/218 |
| 5,219,795 | 6/1993 | Kumai et al. | 437/215 |
| 5,286,680 | 2/1994 | Cain | 437/214 |
| 5,304,843 | 4/1994 | Takubo et al. | 437/211 |
| 5,355,580 | 10/1994 | Tsukada | 174/260 |
| 5,375,320 | 12/1994 | Kinsman et al. | 437/217 |
| 5,378,657 | 1/1995 | Lin | 437/217 |
| 5,390,082 | 2/1995 | Chase et al. | 437/211 |

Primary Examiner—Kevin M. Picardat
Attorney, Agent, or Firm—Lawrence R. Fraley

[57] ABSTRACT

An electronic package assembly wherein lead wires serve to connect conductors on a first substrate (e.g., ceramic) having a semiconductor device (e.g., IC chip) coupled to the conductors and positioned on the substrate, to respective conductors on a second substrate (e.g., a printed circuit board). The lead wires are secured to three different surfaces (e.g., top, side and bottom) of the first substrate, and include curved projection portions for being directly connected to the second substrate conductors.

5 Claims, 3 Drawing Sheets

ELECTRONIC PACKAGE WITH LEAD WIRE CONNECTIONS AND METHOD OF MAKING SAME

This is a divisional of application Ser. No. 08/186,737 filed on Jan. 25, 1994.

TECHNICAL FIELD

The present invention relates to electrical connecting structures for a semiconductor device (IC Chip) and the methods therefor, and more particularly to a structure for electrically connecting a first substrate including an IC chip to a second substrate (e.g., a printed circuit board) on which the first substrate may be positioned.

BACKGROUND OF THE INVENTION

Highly integrated semiconductor chips, such as LSI and VLSI chips are usually electrically connected to a designated package substrate utilizing either wire bonding or what is referred to as "flip chip" bonding procedures, the substrate and chip thereby forming an electronic package. FIG. 5 of the drawings is a view showing one example of such a substrate-chip package assembly. The substrate (40) is may also be referred to as a module substrate, and may be of conventional fiberglass reinforced resin material (a/k/a FR4), or ceramic, as is known. The substrate typically includes a wiring pattern having several electrical conductors (a/k/a electrodes) as part thereof, the chip being coupled to these. The conductors to which the chips are directly coupled are understood to be below the chip in FIG. 5 and thus hidden. These conductors "fan out" in FIG. 5 as part of this wiring pattern to a plurality of peripheral conductors which in turn are to be coupled to associated, respective conductors of a second substrate, e.g., a printed circuit board.

These outer conductors, as mentioned, are electrically connected to respective conductors on the printed circuit board, usually with a plurality of lead wires. This circuit board and wires are not shown in FIG. 5. In other words, both ends of each lead wire are disposed in such a manner that the ends extend around the peripheral side of the package substrate. These ends of the lead wire are typically connected with solder or a conductive bonding agent, the connections being carried out on a wire-by-wire basis which serves to electrically connect and simultaneously mechanically fix the substrate onto the printed circuit board.

One example of such a lead wire connection is disclosed in Japanese PUPA 3-201545. In this example, the lead wire has a circular projection with respect to the plane of the bottom part of the chip's substrate, the projection serving to electrically connect with the conductor (electrode) on the associated printed circuit board. The conductor is electrically connected to the lead wire with a conductive bonding agent.

In addition, IBM Technical Disclosure Bulletin, Vol. 30, No. 3, (August, 1987), pp. 1250, 1241, also discloses a semiconductor device which uses a lead wire for electrically connecting an electrode of a substrate having a chip mounted thereon to an external electrode. In this case, the lead wire has a substantially circular projection with respect to the plane of the bottom part of the substrate in such a manner that the lead wire covers the side of the external periphery of the substrate, the projection serving to electrically connect with the electrode part on the printed circuit board. In this ease the lead wire is fixed to the substrate at two positions, the top of the substrate and the bottom thereof.

As highly integrated IC chips such as LSI and VLSI chips have several electrical input/output (I/O) locations, the number of corresponding electrodes on the chip's substrate must accommodate this number of I/O locations. The total number of these may be several hundred, depending on the operational characteristics of the package. As understood, the size of the chip's substrate is restricted by the size of the printed circuit board on which this substrate is mounted. Both are preferably as small as possible to meet current design objectives toward miniaturization. Consequently, in accordance with the increase in the integration of such chips, the spaces between substrate electrodes have narrowed substantially. Likewise, the spaces between lead wires has been reduced, and the corresponding thickness of the lead wires also reduced.

Reducing lead wire thicknesses and spacings has resulted in various problems. For example, the strength of the individual lead wires has decreased thereby allowing easier deformation thereof by external force. Consequently, in the process of placing the lead wire onto the substrate, adjacent lead wires may come into contact with one another. In addition, electrical connection of several lead wires with electrodes on a printed circuit board wherein the lead wires include circular projections (as described above) may result in an irregular height pattern for these projections with respect to the plane of the bottom of the substrate, thereby presenting the possibility that one or more of these wires may not be electrically connected with its associated electrode on the printed circuit board. The methods described in the above PUPA 3-201545 and IBM Technical Disclosure Bulletin, do not address an effective means of overcoming the above problems.

Japanese PUPA 4-79472 discloses a lead wire fixed with a tape in an attempt to eliminate irregularity in the various spacings between adjacent lead wires. However, the lead wire in this case is manufactured integrally with the electronic component in advance. One end of the lead line extending from the side of the electronic component is electrically connected with the electrode on the printed circuit board with solder.

DISCLOSURE OF THE INVENTION

It is, therefore, an object of the present invention to provide an electrical connecting structure for a semiconductor device and a method therefor, the structure using an extremely large number of fine lead wires to reliably and facilely electrically and mechanically connect, a conductor on the substrate with an IC chip mounted thereon, and with an associated electrode (conductor) on the printed circuit board.

In accordance with one aspect thereof, the present invention sets forth an electrical connecting structure for electrically connecting, through lead wires, a conductor (electrode) on a first substrate bearing an IC chip with an electrode on a second substrate (e.g., printed circuit board) designed for accommodating the first substrate, the lead wires being connected to the first substrate at at least three different locations on the first substrate (e.g., top, bottom, and side). Selected ones of these wires possess a projection extending from a plane coplanar with the bottom of the substrate, and is/are electrically connected at this projection to the conductor (electrode) on the printed circuit board.

BEST MODE FOR CARRYING OUT THE INVENTION

For a better understanding of the present invention, together with other objects, advantages and capabilities thereof, reference is made to the following disclosure in combination with the above-described drawings.

Figure 1:
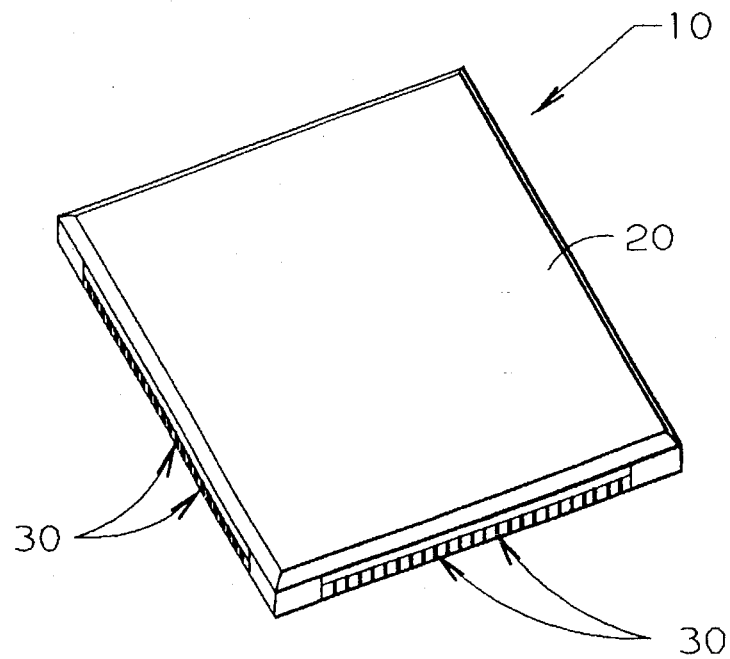
FIG. 1 is a perspective view showing one embodiment of a substrate with the electrical connecting structure of the present invention.
Figure 3:
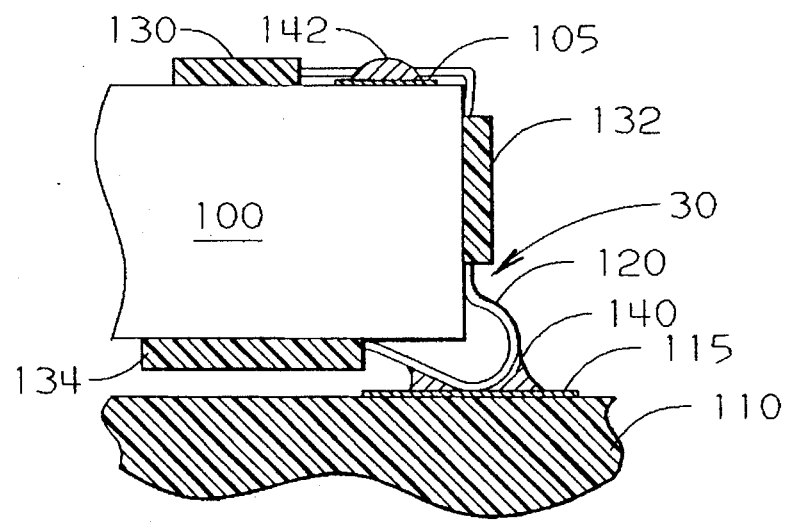
FIG. 3 is an enlarged, partial sectional view, taken along the line 2–2' of FIG. 2, showing the state of connection between a lead wire and substrate of the invention.
Figure 2:
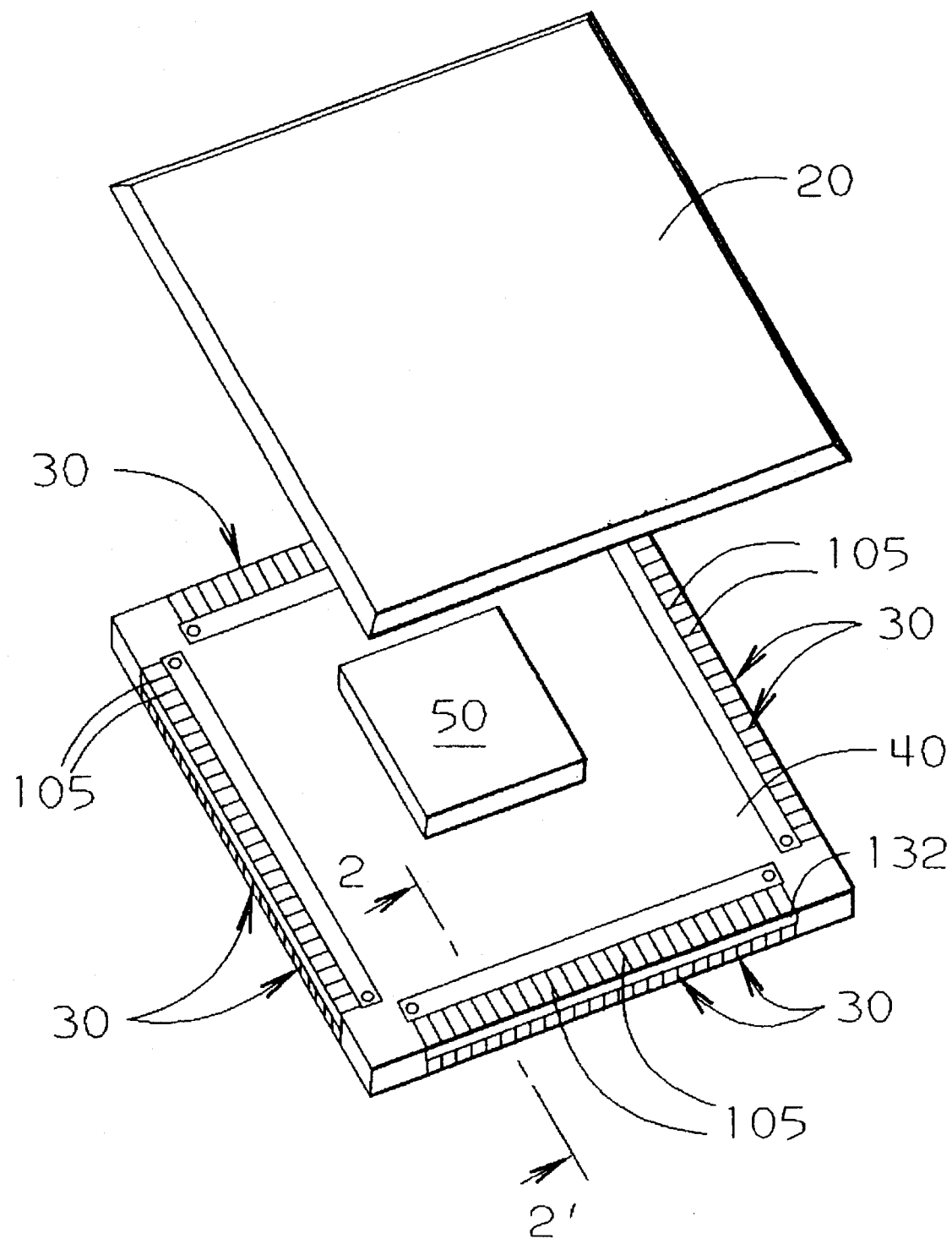
FIG. 2 is a perspective view showing the cap of the substrate shown in FIG. 1 in an open position.
Figure 4:
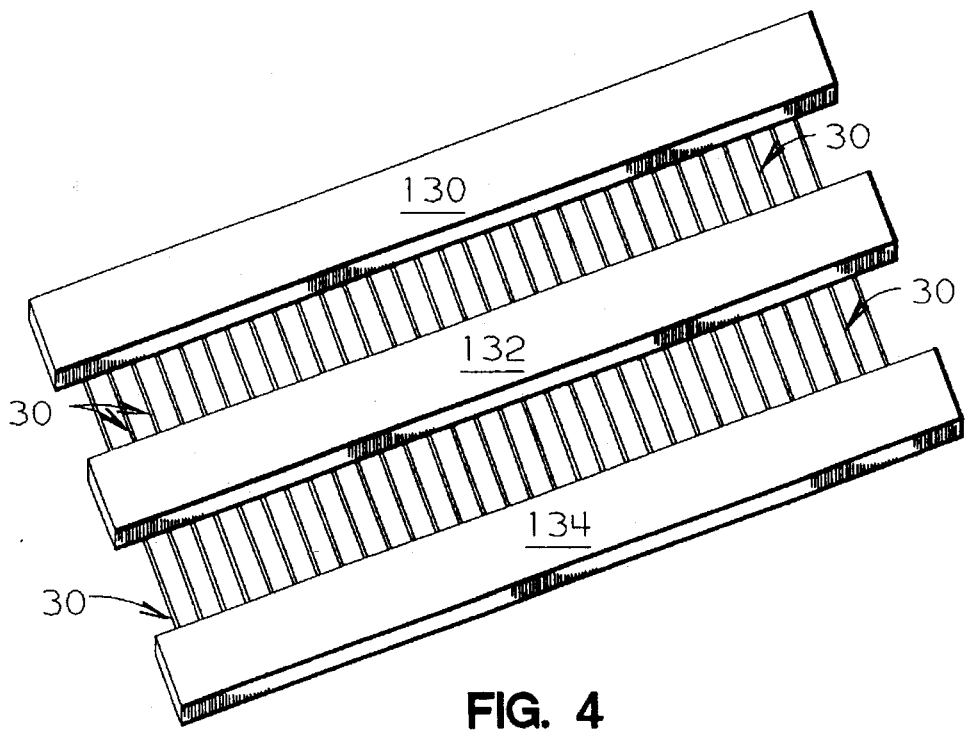
FIG. 4 is a view showing one embodiment of a lead wire before being placed on a substrate.
Figure 5:
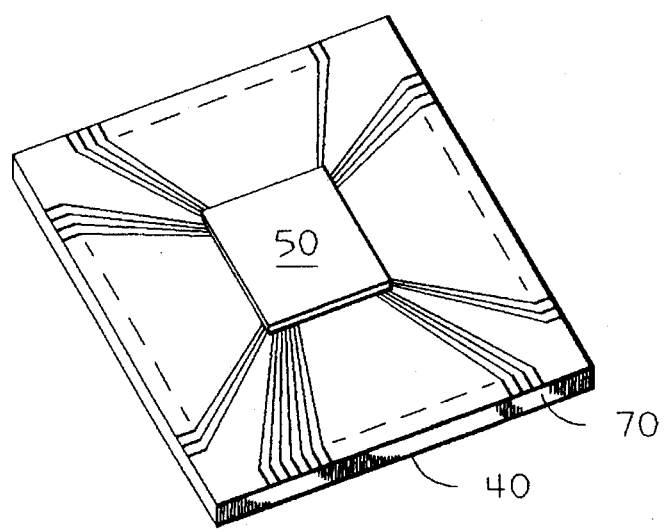
FIG. 5 is a view showing a substrate on which a semiconductor chip (IC) is mounted.

The present invention will be detailed hereinbelow in conjunction with FIGS. 1 through 4, FIG. 5 representing prior art (as mentioned above). FIG. 1 is an overall view of a substrate 10 utilizing the electrically connecting structure of the present invention. The substrate has a protective cap 20 and a plurality of lead wires 30 attached to each of the four sides of the substrate. FIG. 2 is an overall view showing the substrate of FIG. 1, the protective cap 20 being removed. An IC chip 50 is mounted in the central portion of the substrate, identified in FIG. 3 with the numeral 100. The contact sites (electrodes) on the IC chip and conductors on the substrate may be electrically connected with each other using wire bonding, or flip chip bonding (as shown). The conductors on this substrate 100 (for accommodating chip 50) are further connected by the wiring pattern (e.g., as in FIG. 5) on the interior of the substrate to a pattern of conductors 105 located on the peripheral part of the substrate. The wiring pattern may be mounted on the surface of the substrate, as also shown in FIG. 5. In accordance with the teachings herein, the lead wires 30 are fixed on the opposite surfaces (top, bottom) of the first (chip) substrate, in addition to the sides thereof, with a resin tape 130, 132 and 134 (FIG. 3) in the manner provided hereinbelow.

FIG. 3 is a sectional view taken along line 2–2' of FIG. 2, which details the connection between the lead wires 30 and the substrate. Referring to FIG. 3, a representative lead wire 30 is shown as being fixed at three locations on substrate 100, the top and bottom opposite surfaces and the interim side, with a resin tape, such as polyimide tape 130, 132, and 134. Tapes 130 and 132 are shown in FIG. 2. The lead wires are fixed with resin tape through a heat-resistant agent applied to the tapes in advance, or by coating the heat-resistant agent onto the tape in the process of fixing the tape. The lead wires 30 are bent in such a manner that these wires have a circular projection 120 that projects from a plane coplanar with the bottom part of the substrate 100 when it is fixed on the substrate. This projection 120 is electrically connected to an associated conductor (e.g., pad) 115 on a second substrate 110 (e.g., printed circuit board). Accordingly, the conductors 105 of substrate 100 are electrically connected to respective conductors 115 on the printed circuit board. Simultaneously, the upper, first substrate 100 is mechanically bonded to the lower, second substrate 110. The substrate and the board are preferably connected with solder or a conductive bonding agent 140 (at conductor 115), and, in the same manner, the upper part of lead wire 30 and conductor 105 on substrate 100 are electrically connected with solder or a conductive bonding agent 142. Solder or conductive bonding agent are thus used at opposite ends of the connecting lead wires 30.

The connection shown in FIG. 3 is carried out on selected ones (e.g., all) of the lead wires 30 shown in FIG. 2 and FIG. 3. In this case, it is critical that the height of the projections of the lead wires be maintained as uniform as possible. Failure to do so could make it impossible to provide a positive electrical connection (e.g., with solder) at all lead wire locations. Consequently, it is very important that the projection of all lead wires being connected have as uniform a height as possible with respect to the plane of the bottom part of substrate 100. It is also essential that substrate 100 and the printed circuit board 110 be substantially parallel. The procedure described below serves to accomplish this.

FIG. 4 shows one example of a plurality of lead wires 30 before being placed on a respective substrate. In one example, such lead wires were used in what is referred to in the field as a flat pack module. These lead wires were attached to (about) each of the four sides of the module's rectangular substrate (similar to that shown in FIG. 2). Lead wires 30 were made of copper and fixed at equal, spaced intervals using polyimide tape 130, 132, and 134. The width of each lead wire was only about 0.15 mm while the space between adjacent lead wires was only about 0.15 mm. The total number of lead wires for each subassembly shown in FIG. 4 was 126, thus providing a total of 504 wires for a rectangular shaped package assembly such as shown in FIGS. 1–3. A method for manufacturing a connection structure using this lead wire subassembly as shown in FIG. 4 will be detailed below.

The lead wires shown in FIG. 4 are formed to a specific pattern in accordance with the configuration of the side of the substrate on which the lead wires are mounted. In other words, the lead wires are bent in such a manner that these lead wires include a circular projection (120) that projects from a plane coplanar with the bottom of the substrate between the side and bottom polyimide tapes 132 and 134, respectively. In this process, the bottom polyimide tape 134 is fixed (on the bottom of substrate 100) while the polyimide tape 132 is fixed (to the side of the substrate). Preferably, both tapes are fixed with a heat-resistant bonding agent previously applied to the tape. Alternatively, this heat-resistant bonding agent may be applied to the substrate and the polyimide tape added. The reason for using the heat-resistant bonding agent is that the tape can be prevented from coming off when soldering or a high temperature aging is performed, e.g., during a subsequent process.

The lead wires are fixed at equal intervals using polyimide tape 132 and 134. As long as the tapes 132 and 134 are fixed accurately at predetermined positions on the substrate, the spaces between the lead wires do not become irregular. The fixing position of the tape 134 on the bottom of the substrate is predetermined so that the projection 120 of the lead wires maintains a predetermined height with respect to a plane coplanar with the bottom of the substrate. Fixing the tape 134 forms the projection of all the lead wires simultaneously, with the result that the height of the projection does not become irregular, but rather, is uniform.

In the next process, with both tapes 132 and 134 in position, the upper polyimide tape 130 is fixed onto the upper surface of substrate 100. Tape 130 is fixed thereon in the same manner as tape 132 and 134. Following this fixing, conductors 105 on the upper surface of the substrate are connected to respective lead wires with solder 142. This may be accomplished by applying soldering paste on the conductors from above the lead wire, or by screen printing paste before fixing the lead wire with the polyimide tape 130. Final connection is performed by heating the whole substrate (and of course the paste) with a reflow furnace. As an alternative, dip soldering (surface wave) may be used.

In a final step of this process, the projections 120 on the lead wires are connected to the respective conductors 115 on the printed circuit board 110. Solder paste is preferably screen-printed onto the conductors 115 on substrate 100. Then, the lead wires 30 are positioned in contact with the conductors, the substrate 100 located a predetermined distance from board 110. Both substrate 100 and board 110 are parallel. Each projection of lead wire is soldered (by heating the paste) to the conductor on the printed circuit board to which it corresponds. When the substrate 100 is placed on printed circuit board 110, the lead wires can be elastically deformed in the direction vertical to each of the substrates, such that even if the printed circuit board is bent or the height of the printed soldering paste is not uniform, there is little possibility of solder failure.

Understandably, the fixation of lead wires 30 onto the two substrates is not limited to the above procedure. For example, the polyimide tape 130 can be initially fixed on the upper surface of substrate 100, and after soldering of conductor 105 to the respective lead wires on this same surface, the polyimide tapes 132 and 134 may be fixed on the side and bottom portions of the substrate.

Thus there have been shown and described an electrical connecting structure for a semiconductor device and a method for assembling same which assures reliable, yet relatively easy to attain electrical connections and, significantly, simultaneous mechanical connection, of conductors on a first substrate to conductors on a second substrate (such as a printed circuit board). The invention may be accomplished using an extremely large number of fine lead wires.

While there have been shown and described what are at present considered the preferred embodiments of the invention, it will obvious to those skilled in the art that various changes and modifications may be made therein without departing from the scope of the invention as defined by the appended claims.

What is claimed is:

1. A method of making an electronic package, said method comprising the steps of:

providing a first substrate including at least one electrical conductor thereon;

positioning a semiconductor device on said first substrate to electrically connecting said device to said conductor;

providing a second substrate including at least one electrical conductor thereon; and electrically connecting said conductor on said first substrate to said conductor on said second substrate, utilizing at least one lead wire, said connection accomplished by attaching said lead wire to at least three surfaces of said first substrate, said lead wire including a projection portion, said method including electrically connecting said projection portion to said conductor on said second substrate.

2. The method of claim 1 wherein said attaching of said lead wire to said three surfaces of said substrate is accomplished by securing a tape to each of said three surfaces, said lead wire being secured to said tapes.

3. The method of claim 2 wherein said tapes are secured to said surfaces of said first substrate prior to said electrically connecting of said lead wire to said conductor on said first substrate.

4. The method of claim 1 wherein said electrically connecting of said lead wire to said conductors on said first and second substrates is accomplished by soldering.

5. The method of claim 1 wherein said electrically connecting of said lead wire to said conductors on said first and second substrates is accomplished using a conductive binding agent.

\* \* \* \* \*